(12) United States Patent
Eguchi

(10) Patent No.: US 11,011,400 B2
(45) Date of Patent: May 18, 2021

(54) SUBSTRATE-STORING CONTAINER

(71) Applicant: SUMCO CORPORATION, Tokyo (JP)

(72) Inventor: Hirotsugu Eguchi, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 106 days.

(21) Appl. No.: 16/084,369

(22) PCT Filed: Dec. 14, 2016

(86) PCT No.: PCT/JP2016/087177
§ 371 (c)(1),
(2) Date: Sep. 12, 2018

(87) PCT Pub. No.: WO2017/158972
PCT Pub. Date: Sep. 21, 2017

(65) Prior Publication Data
US 2019/0080946 A1 Mar. 14, 2019

(30) Foreign Application Priority Data

Mar. 18, 2016 (JP) .............................. JP2016-054768

(51) Int. Cl.
*H01L 21/673* (2006.01)
*H01L 21/687* (2006.01)

(52) U.S. Cl.
CPC .. *H01L 21/67396* (2013.01); *H01L 21/67306* (2013.01); *H01L 21/67379* (2013.01); *H01L 21/68707* (2013.01)

(58) Field of Classification Search
CPC ......... H01L 21/67396; H01L 21/68707; H01L 21/67306; H01L 21/67379; H01L 21/6735; H01L 21/673

(Continued)

(56) References Cited

U.S. PATENT DOCUMENTS

2002/0135966 A1 * 9/2002 Tanaka .............. H01L 21/67393
361/212
2005/0224391 A1 * 10/2005 Bores ................ H01L 21/67396
206/710

(Continued)

FOREIGN PATENT DOCUMENTS

JP      05-007680 U     2/1993
JP      06-216266 A     8/1994

(Continued)

OTHER PUBLICATIONS

Office Action issued in Japanese family member Patent Appl. No. 2016-054768, dated Mar. 12, 2019, along with an English translation thereof.

(Continued)

*Primary Examiner* — Steven A. Reynolds
(74) *Attorney, Agent, or Firm* — Greenblum & Bernstein, P.L.C.

(57) ABSTRACT

An insulating wafer-storing container for storing substrates inside the container is provided in which at least one exterior surface of the container is formed with a contact portion that is to be in contact with an object other than the container and a non-contact portion that is not to be in contact with the object when the object is brought into contact with the at least one exterior surface, and the area of the contact portion is 40% or less of the total of the area of the contact portion and the area of the non-contact portion.

6 Claims, 8 Drawing Sheets

(58) Field of Classification Search
USPC .................................................. 206/710, 454
See application file for complete search history.

(56) References Cited

U.S. PATENT DOCUMENTS

| | | | |
|---|---|---|---|
| 2006/0243620 A1 | 11/2006 | Odashima et al. | |
| 2007/0297884 A1* | 12/2007 | Jung | H01L 21/67379 414/411 |
| 2008/0251415 A1 | 10/2008 | Yamagishi et al. | |
| 2010/0005966 A1* | 1/2010 | Wibberley | B01D 53/1425 95/179 |
| 2012/0298549 A1* | 11/2012 | Fujimori | H01L 21/67772 206/719 |
| 2013/0146503 A1* | 6/2013 | Wang | H01L 21/67379 206/710 |
| 2014/0086712 A1* | 3/2014 | Oyama | H01L 21/67396 414/222.01 |
| 2014/0299508 A1* | 10/2014 | Wang | B65D 85/30 206/711 |
| 2015/0129459 A1* | 5/2015 | Fuller | H01L 21/67373 206/711 |
| 2015/0214084 A1* | 7/2015 | Schneider | H01L 21/67389 206/711 |
| 2015/0380293 A1* | 12/2015 | Nishijima | H01L 21/6836 206/710 |
| 2018/0269094 A1* | 9/2018 | Babbs | H01L 21/67376 |

FOREIGN PATENT DOCUMENTS

| | | |
|---|---|---|
| JP | 2004-531064 A | 10/2004 |
| JP | 2006-044713 A | 2/2006 |
| JP | 2006-315695 A | 11/2006 |
| JP | 2008-021743 A | 1/2008 |
| JP | 2008-021744 A | 1/2008 |
| JP | 2008-270281 A | 11/2008 |
| JP | 2009-124063 A | 6/2009 |
| JP | 2010-040612 A | 2/2010 |
| JP | 2015-520946 A | 7/2015 |
| WO | WO 2011/102318 A1 | 8/2011 |
| WO | WO2011/102318 A1 | 8/2011 |

OTHER PUBLICATIONS

Official Communication issued in International Bureau of WIPO Patent Application No. PCT/JP2016/087177, dated Mar. 7, 2017, along with an English translation thereof.

Office Action issued in Japanese family member Patent Appl. No. 2016-054768, dated Jan. 7, 2020, along with an English translation thereof.

* cited by examiner

SUBSTRATE-STORING CONTAINER

TECHNICAL FIELD

The present invention relates to a substrate-storing container that stores semiconductor wafers, photomasks, glass substrates, hard disks, or other substrates.

BACKGROUND ART

In semiconductor wafer handling steps such as steps of cleaning, drying, testing, heat treatment, and CVD processing for wafers among the semiconductor wafer production processes and the subsequent semiconductor device production processes, wafers are carried in a state of being stored in a wafer-storing container (also referred to as a "cassette case"). Particularly in a sheet-fed-type wafer processing apparatus, after the container is located at a predetermined position, wafers are taken out one by one from the container using a robot or the like and various processes are performed. As disclosed in Patent Document 1, a typical wafer-storing container is formed by molding an insulating plastic such as polycarbonate (PC) or polyether ether ketone (PEEK) as a whole and comprises a box-shaped container main body that is opened at one side surface, a rack for holding wafers that is fixed in the container main body, and a lid body that is detachably attached to the opening part of the container main body.

PRIOR ART DOCUMENT

Patent Document

[Patent Document 1] JP2010-40612A
[Patent Document 2] JP2008-021744A
[Patent Document 3] JP2008-012743A
[Patent Document 4] Japanese translation of PCT international application, 2004-531064
[Patent Document 5] Domestic re-publication of PCT international application, 2011/102318

SUMMARY OF INVENTION

Problems to be Solved by Invention

The above-described insulating wafer-storing container may be electrostatically charged to a positive potential or a negative potential due to contact, friction, abrasion, and collision with other objects such as an operator and a robot. Particularly in a clean room controlled to low humidity, the possibility of electrostatic charging is remarkably high. If the wafer-storing container is electrostatically charged, the surrounding particles will be electrically adsorbed thereto and/or sparks will occur between the wafer-storing container and the conductive robot hand. This may lead to a problem that contaminants such as metal attach to the wafers. To address such a problem, Patent Documents 2 to 5 propose employing an antistatic material to which a conductive material such as carbon black is added to the material constituting the container, thereby to prevent particles from attaching to the container and substrates by electrostatic force. However, such countermeasures using an antistatic material require changing the material of the substrate-storing container from a general insulating material to an antistatic material, and the problem is therefore that the container will be very expensive. Another problem is that the substrate-storing container composed of an antistatic material is hard and heavy, and cracks and breakage may readily occur.

A problem to be solved by the present invention is to provide a substrate-storing container in which the electrostatic charging can be suppressed by a simple method.

Means for Solving Problems

The present invention solves the above problem by providing an insulating container for storing a substrate inside the container in which at least one exterior surface of the container is formed with a contact portion that is to be in contact with an object other than the container and a non-contact portion that is not to be in contact with the object when the object is brought into contact with the at least one exterior surface, and the area of the contact portion is 40% or less of the total of the area of the contact portion and the area of the non-contact portion.

In the present invention, the at least one exterior surface to be in contact with the object may more preferably have a surface resistance value of $1 \times 10^{11} \Omega$ or more. In the present invention, the contact portion may be a projected part and the non-contact portion may be a recessed part relative to the projected part.

In the present invention, the exterior surface to be in contact with the object may be an exterior surface of a hexahedral body or a cylindrical body, or the exterior surface to be in contact with the object may be a specific contact surface provided on an exterior surface of a hexahedral body or a cylindrical body.

In the present invention, the substrate may be a substrate that includes at least any of a semiconductor wafer, a photomask, a glass substrate, and a hard disk.

Effect of Invention

The substrate-storing container is electrostatically charged due to contact, friction, abrasion, and collision (collectively referred to as "contact," hereinafter) with other objects than the container, but the charged surface potential correlates with the contact area. In particular, the present inventor has found that the occurrence rate of sparks due to the charged potential is almost 0% when the contact area is 40% or less. According to the present invention, at least one surface to be in contact with an object other than the container is formed with the contact portion which is to be in contact with the object and the non-contact portion which is not to be in contact with the object, and the area of the contact portion is 40% or less of the total of the area of the contact portion and the area of the non-contact portion; therefore, the surface potential due to charging is reduced to a level at which the spark occurrence rate is 0%. As a result, surrounding particles are prevented from attaching to the substrate, and contaminants caused by the spark occurrence are also prevented from attaching to the substrate.

MODE(S) FOR CARRYING OUT THE INVENTION

Hereinafter, one or more embodiments of the present invention will be described with reference to the drawings.

Figure 1:
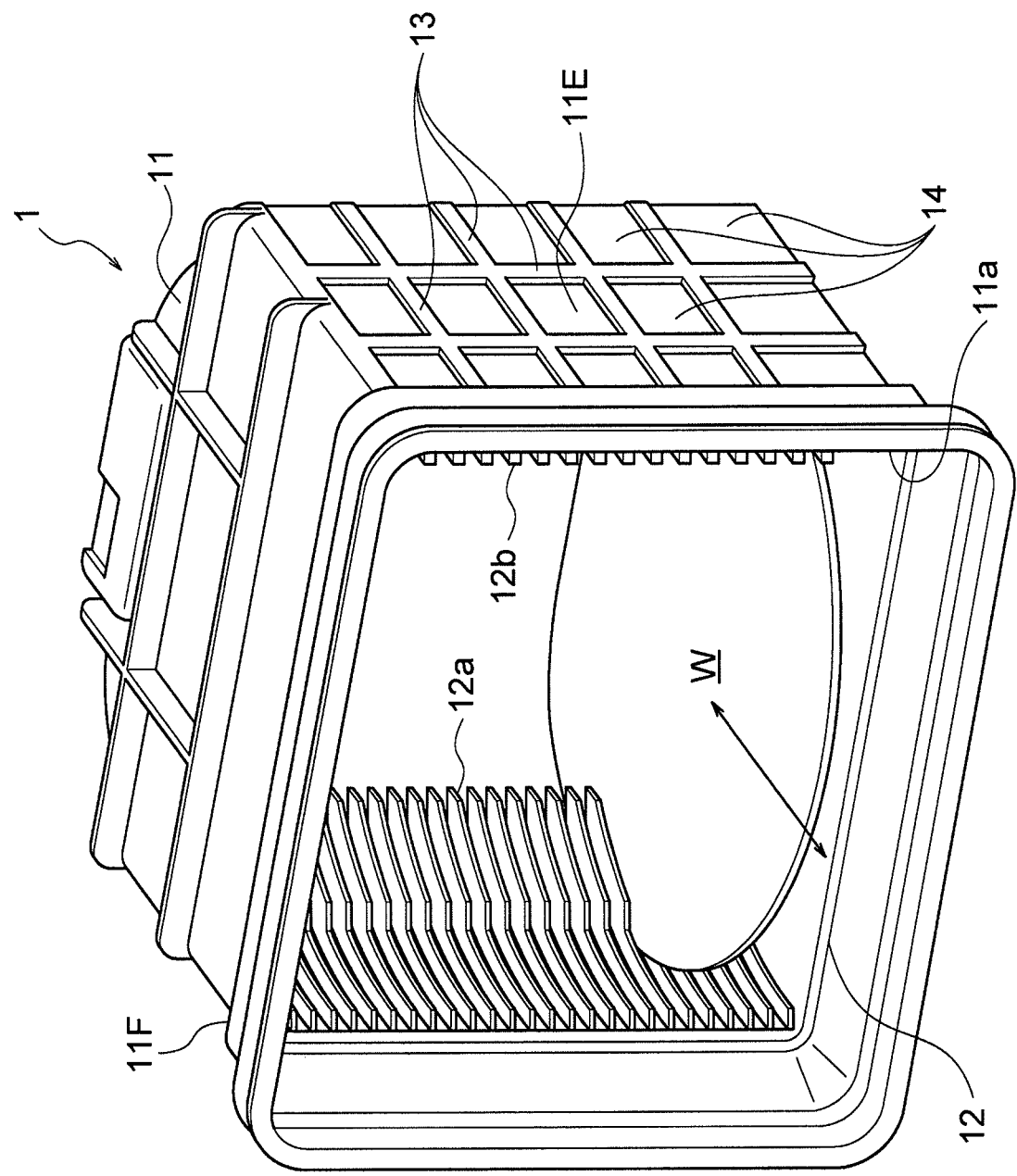
FIG. 1 is a perspective view illustrating an embodiment of a substrate-storing container according to the present invention.

FIG. 1 is a perspective view illustrating a wafer-storing container 1 which is an embodiment of the substrate-storing container according to the present invention. The wafer-storing container 1 of the present embodiment is a so-called cassette case for storing and carrying a plurality of semiconductor wafers (also referred to as "wafers" in a simple term, hereinafter) in steps of handling the wafers, such as a production process for wafers and a subsequent production process for semiconductor devices. Examples of such steps include steps of cleaning, drying, and testing of the wafers. As illustrated in FIG. 1, the wafer-storing container 1 of the present embodiment comprises a container main body 11 that can store a plurality of wafers W, a rack 12 for holding wafers that is provided in the container main body 11, and a lid body (not illustrated) that can be detachably attached to an opening part 11a of the container main body 11 and opens and closes the opening part 11a.

Figure 5:
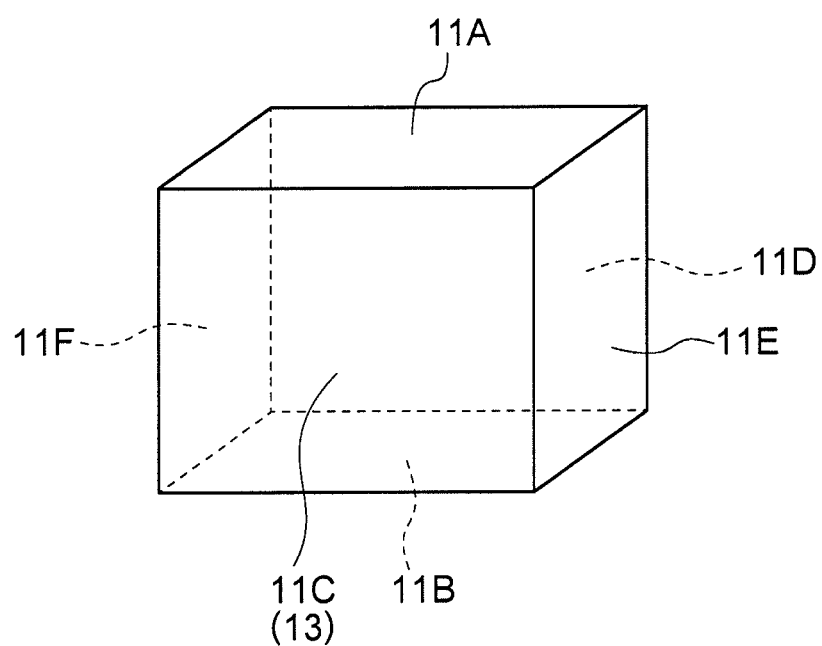
FIG. 5 is a perspective view schematically illustrating a substrate-storing container according to the present invention.

The container main body 11 is composed of an insulating material and formed, for example, by molding a plastic such as polycarbonate (PC) or polyether ether ketone (PEEK). The container main body 11 is substantially in a hexahedral box-like shape, that is, approximately in a cuboid box-like shape, and its one side surface (front side in FIG. 1) is formed with the opening part 11a. The wafers W are carried into the container main body 11 from the opening part 11a and stored in the container main body 11. On the other hand, the stored wafers W are carried out of the container main body 11 from the opening part 11a. FIG. 5 is a perspective view schematically illustrating a substrate-storing container according to the present invention, which corresponds to the wafer-storing container 1 illustrated in FIG. 1. As illustrated in FIG. 5, six surfaces of the container main body 11 will hereinafter be referred to as an upper surface 11A, a bottom surface 11B, a front surface 11C, a back surface 11D, a right-side surface 11E, and a left-side surface 11F. The opening part 11a is provided at the front surface 11C. The surface resistance value of the wafer-storing container 1 molded from the above plastic is $1\times10^{11}\Omega$ or more.

The rack 12 provided in the container main body 11 includes a pair of wafer holders 12a and 12b arranged so as to face the right-side surface 11E and the left-side surface 11F which are adjacent to the opening part 11a of the container main body 11. The wafer holders 12a and 12b are each formed with a plurality of grooves for wafer holding that extend in the insertion and extraction direction (arrow direction in FIG. 1) of the wafers W. The groove width of the grooves is larger than the thickness of the wafers W, and the wafers W are inserted into the grooves. The distance between tip parts of the wafer holders 12a and 12b which face each other is narrower than the diameter dimension of the wafers W. When the wafers W are inserted into the container main body 11, therefore, both ends of each wafer W get into the grooves of the wafer holders 12a and 12b. In other words, the wafer W inserted into the container main body 11 is held by the wafer holders 12a and 12b at both ends of the wafer W. Again, the wafer holders 12a and 12b are each formed with a plurality of grooves, so that the plurality of wafers W can be held in the container main body 11 at intervals.

In such a wafer-storing container 1, when the container main body 11 is horizontally placed in a posture as illustrated in FIG. 1, that is, in such a posture that the opening part 11a is located on the lateral side (in a horizontally orientated state) and the right-side surface 11E and left-side surface 11F arranged with the wafer holders 12a and 12b are located on both side parts, the wafers W stored in the container main body 11 are in a horizontal state (horizontally placed state). When the wafer-storing container 1 is placed on the table of a processing apparatus for performing a heat treatment process or a CVD process, the container main body 11 may be horizontally placed. Here, when the wafer-storing container 1 is carried to a certain place, such as the table of a processing apparatus, in a posture as illustrated in FIG. 1, an operator or a working robot grips the right-side surface 11E and the left-side surface 11F, but the wafer-storing container 1 is electrostatically charged when the operator's hands (usually gloved with nitrile gloves) or the working robot's hands (usually covered with insulating materials) contact and separate from these right-side surface 11E and left-side surface 11F. Particularly in a clean room of a temperature of 18° C. to 25° C. and a humidity of 25% to 45%, the wafer-storing container 1 is more likely to be electrostatically charged than in a high temperature and humidity environment.

Figure 7:
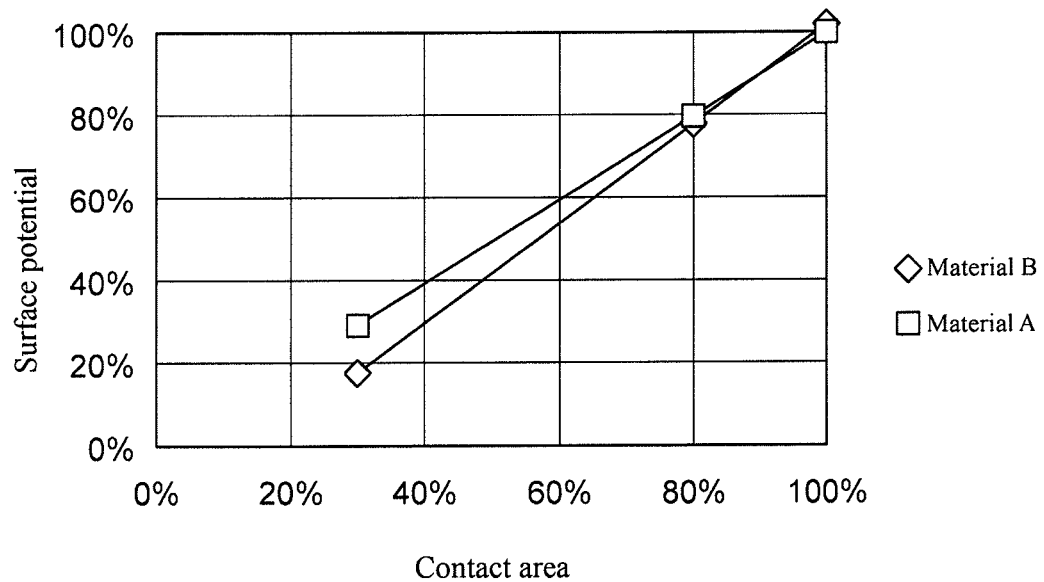
FIG. 7 is a graph illustrating results of measuring the relationships between a contact area and a surface potential in the substrate-storing containers of FIG. 1.
Figure 8:
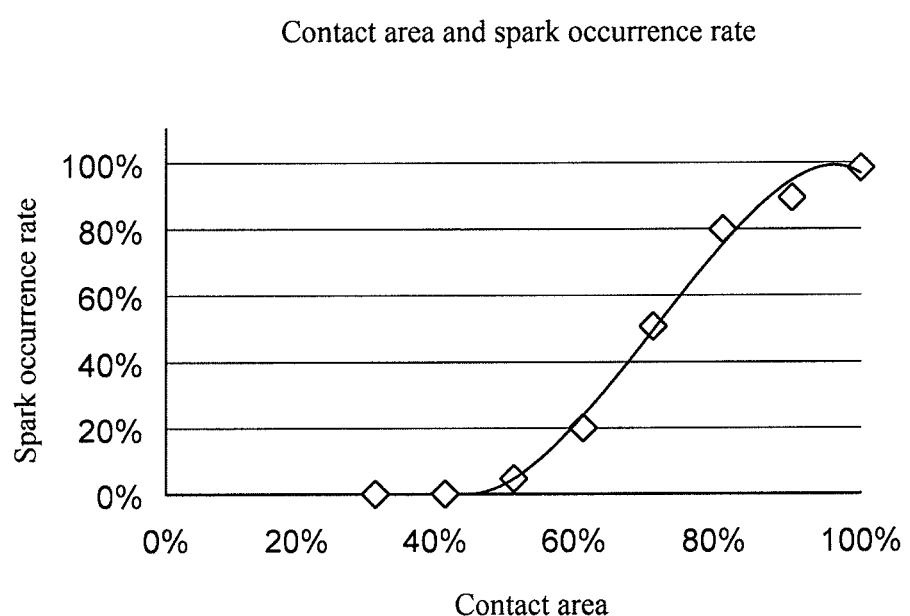
FIG. 8 is a graph illustrating a result of measuring the relationship between a contact area and a spark occurrence rate in the substrate-storing container of FIG. 1.

FIG. 7 is a graph illustrating results of measuring the charged potential of surfaces when the contact area is 100%, 80%, and 30% with respect to the right-side surfaces 11E and left-side surfaces 11F of the wafer-storing containers 1 molded of different materials A and B. The contact area of the horizontal axis represents the area ratio of the right-side surface 11E and left-side surface 11F of the wafer-storing container 1 with which an operator or a working robot is in contact. The charged potential is measured on the assumption that the area ratio is 100% when the operator or working robot is in contact with the entire right-side surface 11E and the entire left-side surface 11F of the container main body 11. As a result, it has been confirmed that the surface potential decreases as the contact area decreases even with different materials of the wafer-storing container 1. FIG. 8 is a graph illustrating results of measuring the spark occurrence rate at the time of taking out the wafers from the wafer-storing container 1 using a conductive robot arm when the contact area is 100%, 90%, 80%, 70%, 60%, 50%, 40%, and 30% with respect to the right-side surface 11E and left-side surface 11F of the wafer-storing container 1. These results show that the spark occurrence rate is 50% when the contact area is 70%, the spark occurrence rate is 20% when the contact area is 60%, and the spark occurrence rate can be 0% when the contact area is 40% or less.

Figure 2:
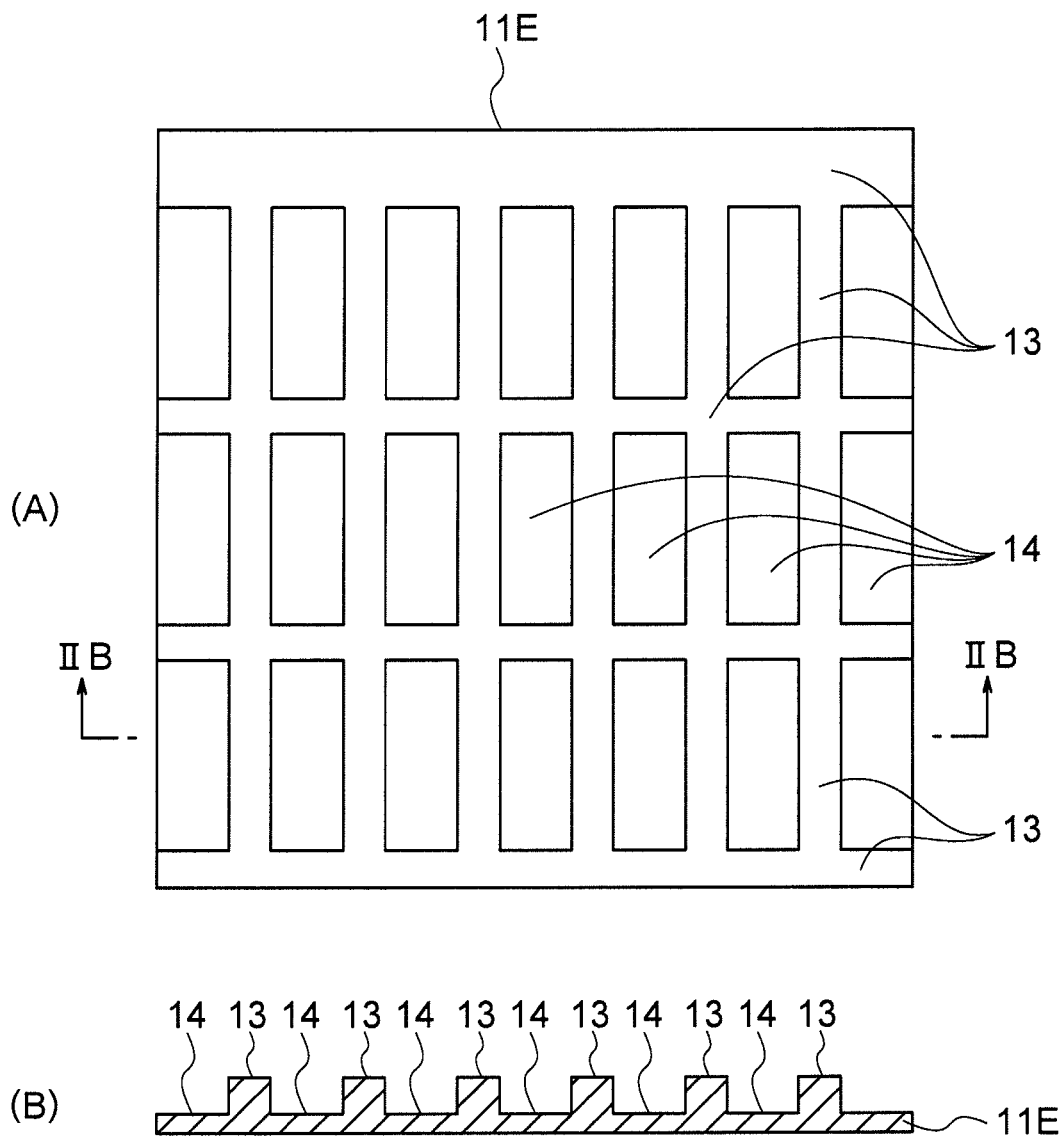
FIG. 2 is a set of a front view (A) and a cross-sectional view (B) illustrating an example of the pattern of a contact portion and non-contact portions of FIG. 1.

In the wafer-storing container 1 of the present embodiment, therefore, one or more surfaces to be in contact with objects other than the container, which are the operator's hands or working robot's hands in the present embodiment, that is, the right-side surface 11E and left-side surface 11F illustrated in FIG. 1 and FIG. 5, are formed with contact portions 13 that are to be in contact with the operator's hands or working robot's hands and non-contact portions 14 that are not to be in contact with the operator's hands or working robot's hands, and the area of the contact portions 13 is 40% or less of the total of the area of the contact portions 13 and the area of the non-contact portions 14. Specifically, as illustrated in FIG. 1 to FIG. 4, the contact portions 13 are projected parts and the non-contact portions 14 are recessed parts relative to the projected parts. FIG. 2 is a set of a front view (A) and a cross-sectional view (B) illustrating an example of the pattern of a contact portion 13 and non-contact portions 14 of FIG. 1. The cross-sectional view (B) is taken along line IIB-IIB.

The contact portion 13 illustrated in FIGS. 1 and 2 is composed of straight strip-like projected parts that are arranged in a lattice pattern in the longitudinal and lateral directions and intersect each other, and rectangular portions surrounded by the contact portion 13 composed of the projected parts constitute the non-contact portions 14 formed as the recessed parts. In the example illustrated in FIG. 2, the entire right-side surface 11E of the wafer-storing container 1 is formed with the contact portion 13 comprising four lateral and six longitudinal lattice-like projected parts, and portions surrounded by the contact portion 13 are the non-contact portions 14 comprising 21 rectangular recessed parts. If the front view of FIG. 2 is in the correct size, the ratio of the area of the contact portion 13 and the area of the right-side surface 11E is 150:400, and the area of the contact portion 13 is 37.5% of the total of the area of the contact portion 13 and the area of the non-contact portions 14. The raised shape of the projected part as the contact portion 13 may be raised perpendicularly to the right-side surface 11E. In an alternative embodiment, the projected part may be raised aslope so as to decrease in size toward the top surface. This allows the area of the contact portion 13 to be set smaller.

Figure 3:
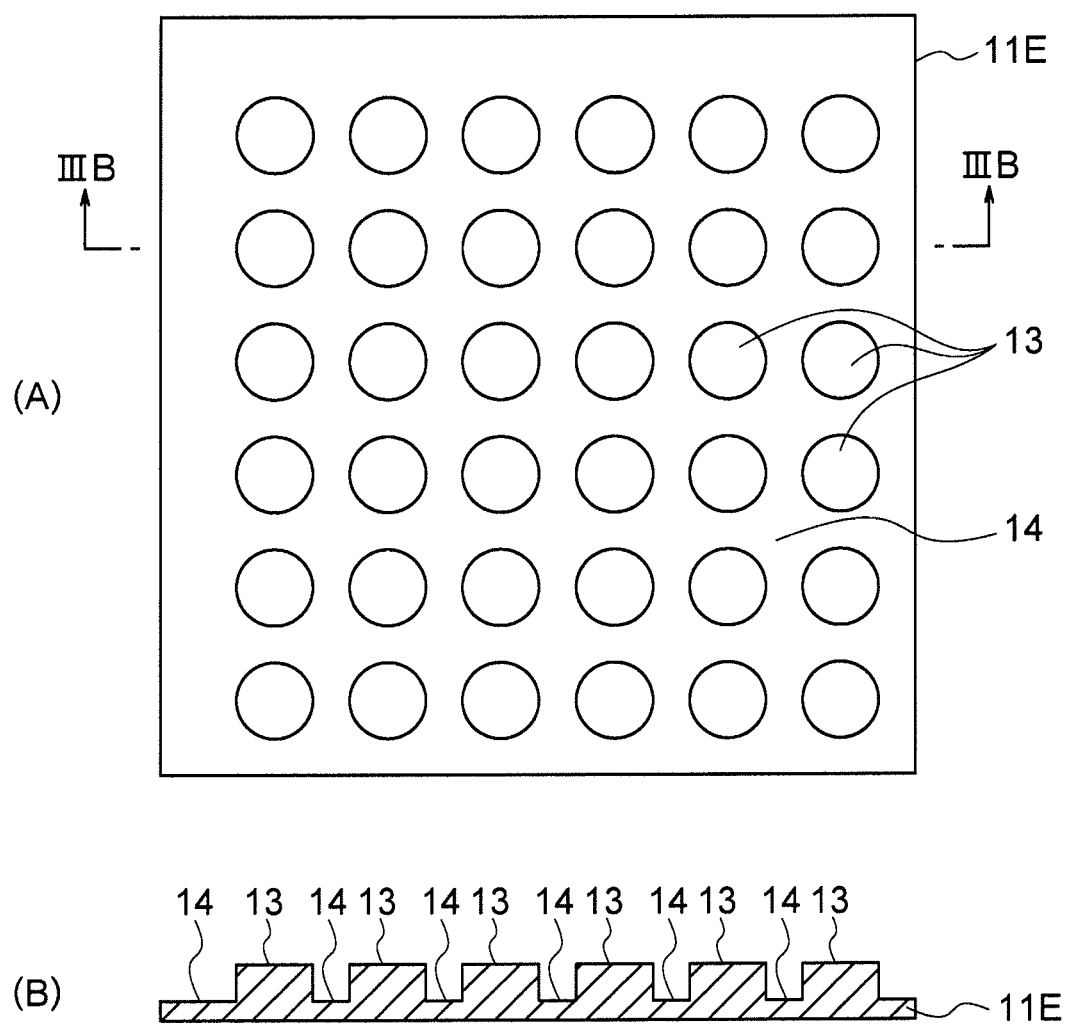
FIG. 3 is a set of a front view (A) and a cross-sectional view (B) illustrating another example of the pattern of contact portions and a non-contact portion of FIG. 1.

FIG. 3 is a set of a front view (A) and a cross-sectional view (B) illustrating another example of the pattern of contact portions and a non-contact portion of FIG. 1. The cross-sectional view (B) is taken along line IIIB-IIIB. The contact portions 13 illustrated in FIG. 3 are composed of a plurality of circular projected parts that are regularly arranged in the longitudinal and lateral directions, and a portion from which the circular contact portions 13 composed of the projected parts are removed constitutes the non-contact portion 14 formed as a recessed part. In the example illustrated in FIG. 3, the entire right-side surface 11E of the wafer-storing container 1 is formed with the contact portions 13 comprising 36 circular projected parts of six rows in the lateral direction and six rows in the longitudinal direction, and a portion surrounded by the contact portions 13 is the non-contact portion 14 comprising a recessed part. If the front view of FIG. 3 is in the correct size, the ratio of the area of the contact portions 13 and the area of the right-side surface 11E is 283:1000, and the area of the contact portions 13 is 28.3% of the total of the area of the contact portions 13 and the area of the non-contact portion 14. The raised shape of the circular projected parts as the contact portions 13 may be raised perpendicularly to the right-side surface 11E. In an alternative embodiment, the circular projected parts may be raised aslope so as to decrease in size toward the top surfaces. In other words, the contact portions 13 may be formed in a circular truncated cone-like shape or a conical shape, and the area of the contact portions 13 can thereby be set smaller.

Figure 4:
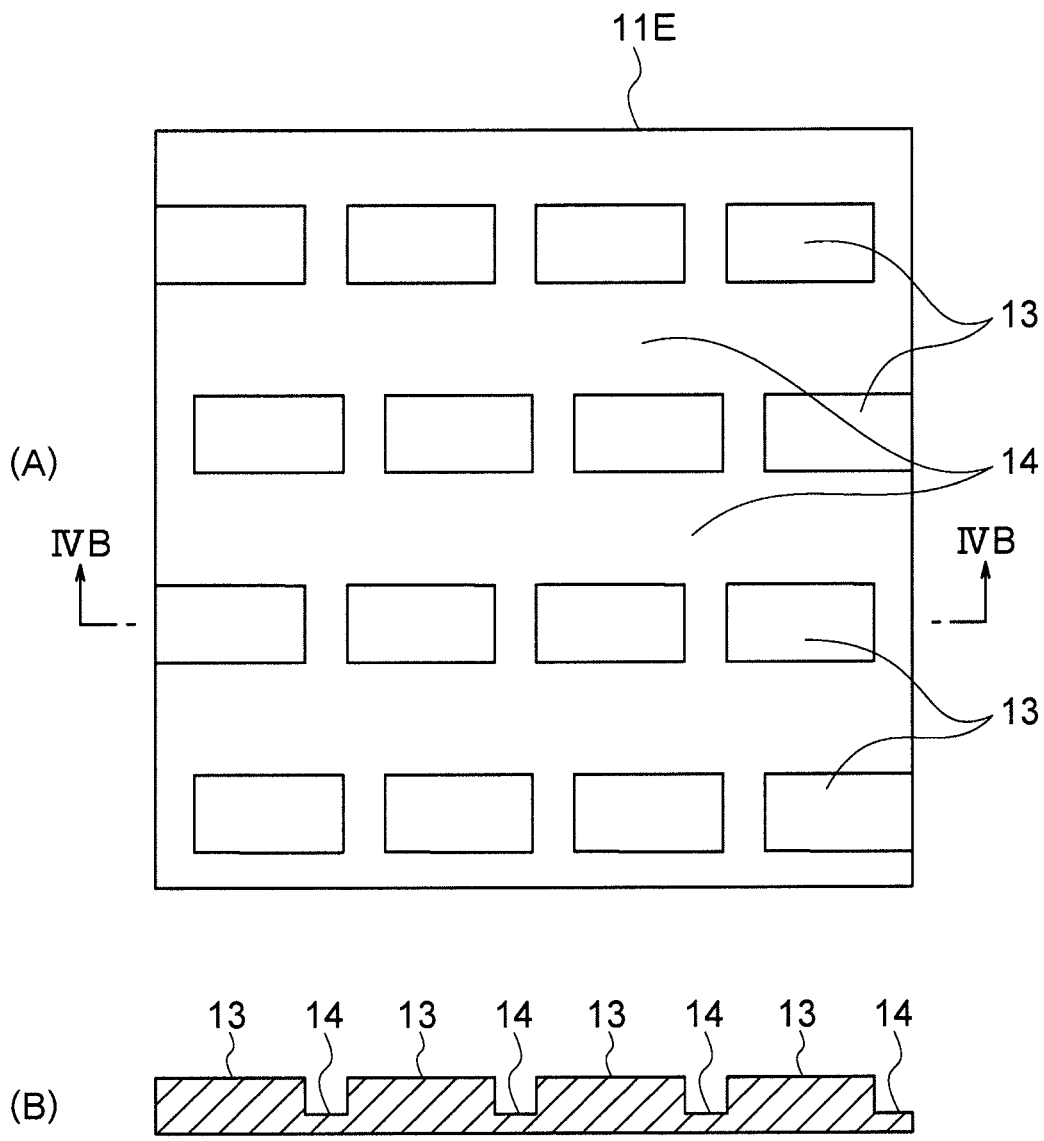
FIG. 4 is a set of a front view (A) and a cross-sectional view (B) illustrating still another example of the pattern of contact portions and a non-contact portion of FIG. 1.

FIG. 4 is a set of a front view (A) and a cross-sectional view (B) illustrating still another example of the pattern of contact portions and a non-contact portion of FIG. 1. The cross-sectional view (B) is taken along line IVB-IVB. The contact portions 13 illustrated in FIG. 4 are composed of a plurality of rectangular projected parts that are regularly arranged in the longitudinal and lateral directions, and a portion from which the rectangular contact portions 13 composed of the projected parts are removed constitutes the non-contact portion 14 formed as a recessed part. In the example illustrated in FIG. 4, the entire right-side surface 11E of the wafer-storing container 1 is formed with the contact portions 13 comprising 16 rectangular projected parts of four rows in the lateral direction and four rows in the longitudinal direction, and a portion surrounded by the contact portions 13 is the non-contact portion 14 comprising a recessed part. If the front view of FIG. 4 is in the correct size, the ratio of the area of the contact portions 13 and the area of the right-side surface 11E is 128:400, and the area of the contact portions 13 is 32% of the total of the area of the contact portions 13 and the area of the non-contact portion 14. The raised shape of the rectangular projected parts as the contact portions 13 may be raised perpendicularly to the right-side surface 11E. In an alternative embodiment, the rectangular projected parts may be raised aslope so as to decrease in size toward the top surfaces. This allows the area of the contact portions 13 to be set smaller.

It can be said that the arrangement pattern in the plan view of the projected parts serving as the contact portions 13 and the recessed parts serving as the non-contact portions 14 is preferably designed such that they are uniformly formed at equal intervals and the same size on the entire right-side surface 11E and/or the entire left-side surface 11F of the wafer-storing container 1 (or contact portions with the operator's hands or working robot's hands). Note, however, that the present invention is not limited to such a regular arrangement pattern, and an irregular arrangement pattern may also be employed.

Figure 6:
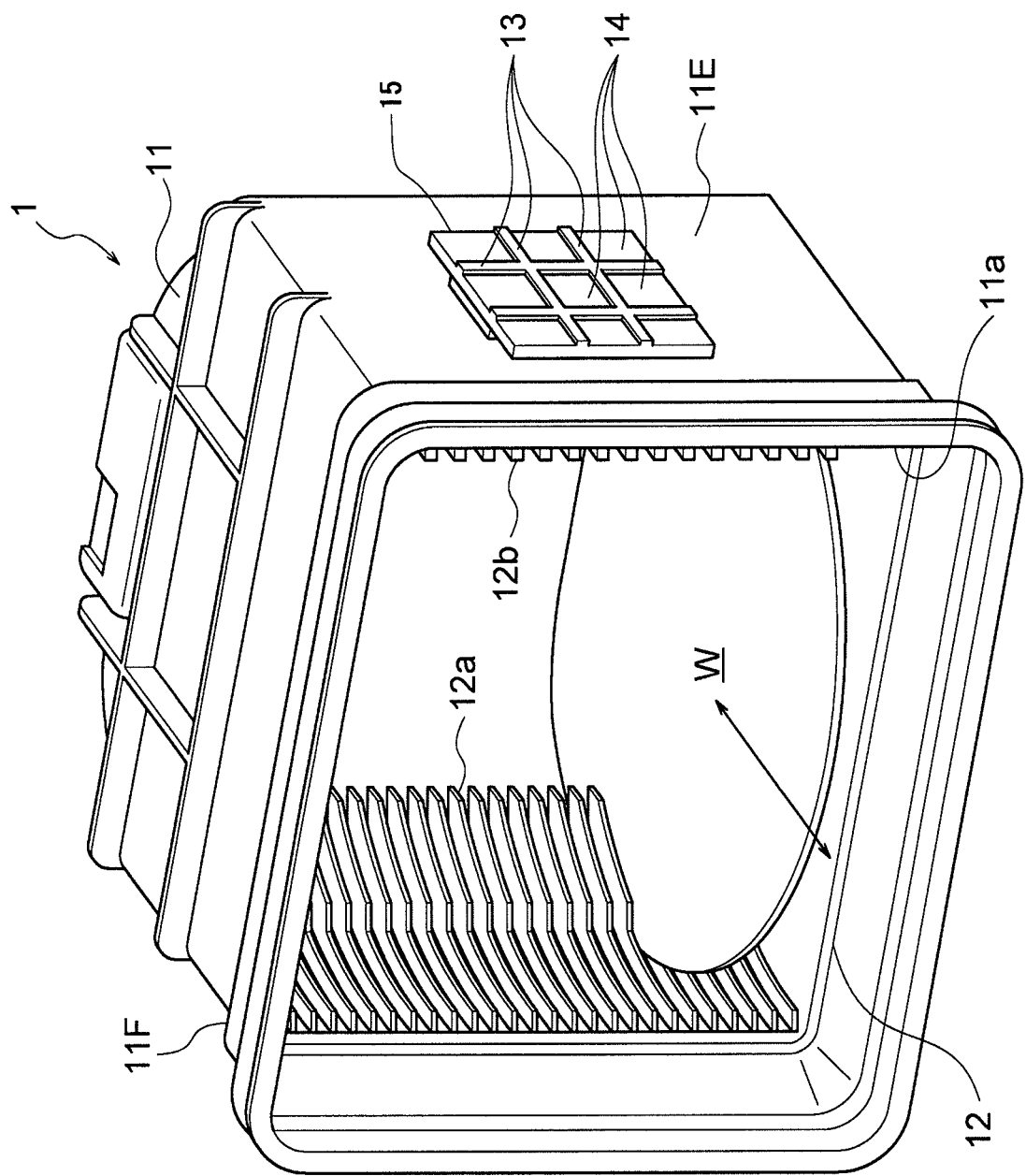
FIG. 6 is a perspective view illustrating another embodiment of the substrate-storing container according to the present invention.

In the wafer-storing container 1 illustrated in FIG. 1, portions that may come into contact with the operator's hands or working robot's hands are the entire right-side surface 11E and the entire left-side surface 11F of the container main body 11. In the wafer-storing container 1 illustrated in FIG. 1, therefore, the contact portions 13 are formed to have an area of 40% or less of the entire right-side surface 11E and the entire left-side surface 11F. However, when portions that may come into contact with the operator's hands or working robot's hands are, for example, grip parts 15 provided on the right-side surface 11E and left-side surface 11F of the wafer-storing container 1 as illustrated in FIG. 6, the grip parts 15 are formed with the contact portions 13 and the non-contact portions 14, and the area of the contact portions 13 is 40% or less of the area of the entire grip parts 15.

As described above, according to the wafer-storing container 1 of the present embodiment, the occurrence of sparks can be prevented, such as when the wafers stored therein are taken out, merely by setting the contact area of the portions, which may come into contact with objects, to 40% or less of the whole without changing the material of the container main body 11 to a special one such as an antistatic material and without performing a charge removal process such as using an ionizer. Moreover, not only the occurrence of sparks can be prevented, but also foreign substances such as particles can be suppressed from attaching to the wafers because the charging itself is suppressed.

DESCRIPTION OF REFERENCE NUMERALS

1 Wafer-storing container
  11 Container main body
    11A Upper surface
    11B Bottom surface
    11C Front surface
    11D Back surface
    11E Right-side surface
    11F Left-side surface
  12 Rack
    12a, 12b Wafer holder
  11a Opening part
  13 Contact portion
  14 Non-contact portion
  15 Grip part

The invention claimed is:

1. A substrate-storing container comprising an insulating and box-shaped container main body, the insulating and box-shaped container main body comprising:
  exterior surfaces;
  an opening;
  an interior into which a substrate is stored from the opening; and
  a plurality of projected parts regularly arranged vertically and horizontally on each of a left side surface and a right side surface of the insulating and box-shaped container main body when the opening is on a front surface thereof,
  wherein the plurality of projected parts comprises a contact portion configured to contact hands of one of an operator or a working robot,
  wherein parts between the plurality of projected parts comprise a non-contact portion configured to not contact the hands of one of an operator or a working robot,
  wherein the contact portion and non-contact portion form a uniform pattern over the entire surface of each of the left side surface and the right side surface,
  wherein the height of each projected part of the plurality of projected parts is the same, and
  wherein a total area of the contact portion on each of the left side surface and the right side surface is 40% or less of an area of each of the left side surface and the right side surface.

2. A substrate-storing container comprising an insulating and box-shaped container main body, the insulating and box-shaped container main body comprising:
  exterior surfaces;
  an opening;
  an interior into which a substrate is stored from the opening;
  grips which are projected on each of a left side surface and a right side surface of the insulating and box-shaped container main body when the opening is on a front surface thereof; and
  a plurality of projected parts regularly arranged vertically and horizontally on a surface of each of the grips,
  wherein the plurality of projected parts comprises a contact portion configured to contact hands of one of an operator or a working robot,
  wherein parts between the plurality of projected parts comprise a non-contact portion configured to not contact the hands of one of an operator or a working robot,
  wherein the contact portion and non-contact portion form a uniform pattern over the entire surface of each of the grips,
  wherein the height of each projected part of the plurality of projected parts is the same, and
  wherein a total area of the contact portion on the surface of each of the grips is 40% or less of an area of the surface of each of the grips.

3. The substrate-storing container according to claim 1, wherein each of the left side surface and the right side surface has a surface resistance value of $1 \times 10^{11} \Omega$ or more.

4. The substrate-storing container according to claim 1, wherein the substrate includes any of a semiconductor wafer, a photomask, a glass substrate, and a hard disk.

5. The substrate-storing container according to claim 2, wherein each of the left side surface and the right side surface has a surface resistance value of $1 \times 10^{11} \Omega$ or more.

6. The substrate-storing container according to claim 1, wherein the contact portion and non-contact portion are unitarily formed in each of the left side surface and the right side surface.

* * * * *